United States Patent [19]

Audaire et al.

[11] Patent Number: 5,113,263
[45] Date of Patent: May 12, 1992

[54] REDUCED SIZE ACCURATE SOLID-STATE CAMERA HAVING LOW POWER CONSUMPTION

[75] Inventors: Luc Audaire; Philippe Pantigny, both of Grenoble, France

[73] Assignee: Commissariat a l'Energie Atomique, Paris, France

[21] Appl. No.: 634,759

[22] Filed: Dec. 27, 1990

[30] Foreign Application Priority Data

Dec. 29, 1989 [FR] France .............. 89 17448

[51] Int. Cl.⁵ .......................... H04N 5/335
[52] U.S. Cl. .................. 358/213.11; 358/209; 358/213.19; 358/213.26
[58] Field of Search ............ 358/213.11, 219.13, 358/219.19, 213.26, 199, 206; 250/208.1, 234, 235, 236; 359/117; 385/17, 18, 120

[56] References Cited

U.S. PATENT DOCUMENTS

| | | | |
|---|---|---|---|
| 4,054,797 | 10/1977 | Milton et al. | 250/332 |
| 4,280,141 | 7/1981 | McCann et al. | 358/213.26 |
| 4,449,147 | 5/1984 | Ogasawara | 358/212 |
| 4,609,823 | 9/1986 | Beger et al. | 250/370 |
| 4,695,889 | 9/1987 | Portmann | 358/213.26 |

FOREIGN PATENT DOCUMENTS 0145543 6/1985 European Pat. Off.
0193443 9/1986 European Pat. Off.
3043677 11/1979 Fed. Rep. of Germany.

Primary Examiner—Michael Razavi
Assistant Examiner—Tuan V. Ho
Attorney, Agent, or Firm—Michael N. Meller

[57] ABSTRACT

A reduced size solid state camera includes an array of detectors having reading circuits and electronic row and column scanning circuits utilizing CCD-type structures. Each of the column scanning circuits has an integrated part adjacent the detectors with a spacing equal to or smaller than that of the rows of detectors. The movement of the image to be photographed takes place in a direction perpendicular to the columns of detectors and may occur in two successive opposite directions. A scanning circuit for the row supplies a signal representing an image for each image movement direction. The circuitry includes a signal processor which sums up the signals corresponding to the same element of the image that has moved passed all of the detectors of a row.

13 Claims, 10 Drawing Sheets

REDUCED SIZE ACCURATE SOLID-STATE CAMERA HAVING LOW POWER CONSUMPTION

DESCRIPTION

The present invention relates to a camera with integrated scanning circuits. It more particularly applies to the production of reduced size, very accurate cameras.

Cameras with integrated scanning circuits are known. The latter use so-called charge coupled structures. Throughout the present description these structures will be referred to by the abbreviation CCD for charge coupled device. In order to facilitate the reading of the present text, reference should be made to Chapter E2210 pp. 1 to 12 of the Journal "Techniques de l'Ingenieur," which provides a synopsis of charge coupled devices and their application to cameras.

Figure 1:
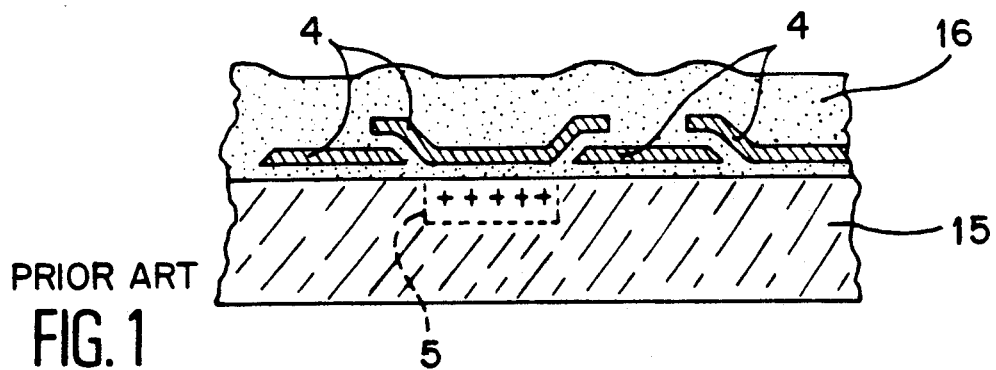

With reference to FIG. 1, a brief description will be given of the operation and structure of a CCD. An insulating layer 16, e.g. of $SiO_2$, rests on a semiconductor substrate 15, e.g. of Si. Electrodes 4 known as gates are inserted in the layer 16. The edges of every other gate are superimposed on the edges of the adjacent gates.

An adequate control potential applied to one of the gates 4 via not shown connections modifies the potential at the interface of the semiconductor and the dielectric. Perpendicular to the selected gate, the carriers are removed from the silicon over a thickness of a few micrometers in order to form a depleted zone 5.

It is clear that as a result of the adequate potentials applied to the gates 4, three gates makes it possible to form a potential well (positioned level with the depleted zone 5) which can be filled with electrons. Between the different gates, the potential steps have an amplitude regulatable by the control potentials applied to the gates.

Charges stored in such a potential well can be displaced into different stages of the CCD defined by the gates or can be added to other charges in a stage by applying adequate control potentials. Different uses of such CCD's will be described hereinafter.

Figure 2:
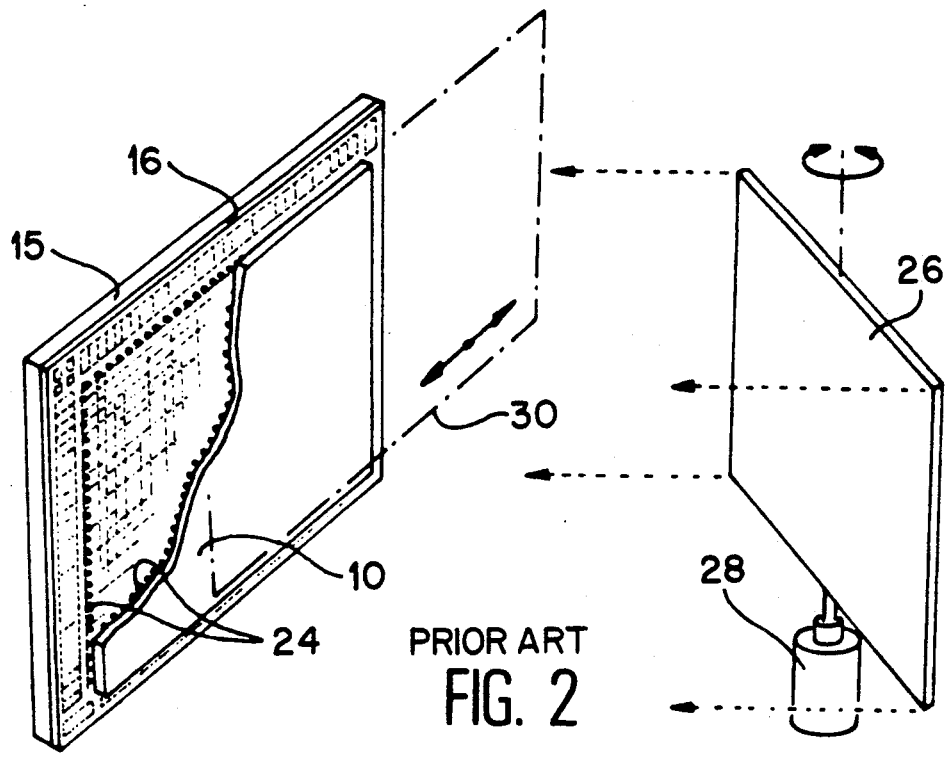
Figure 3:
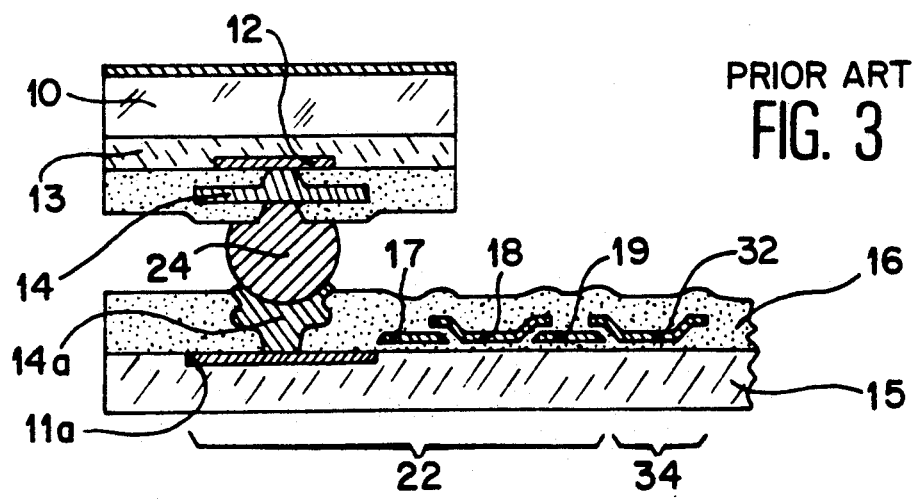
Figure 4:
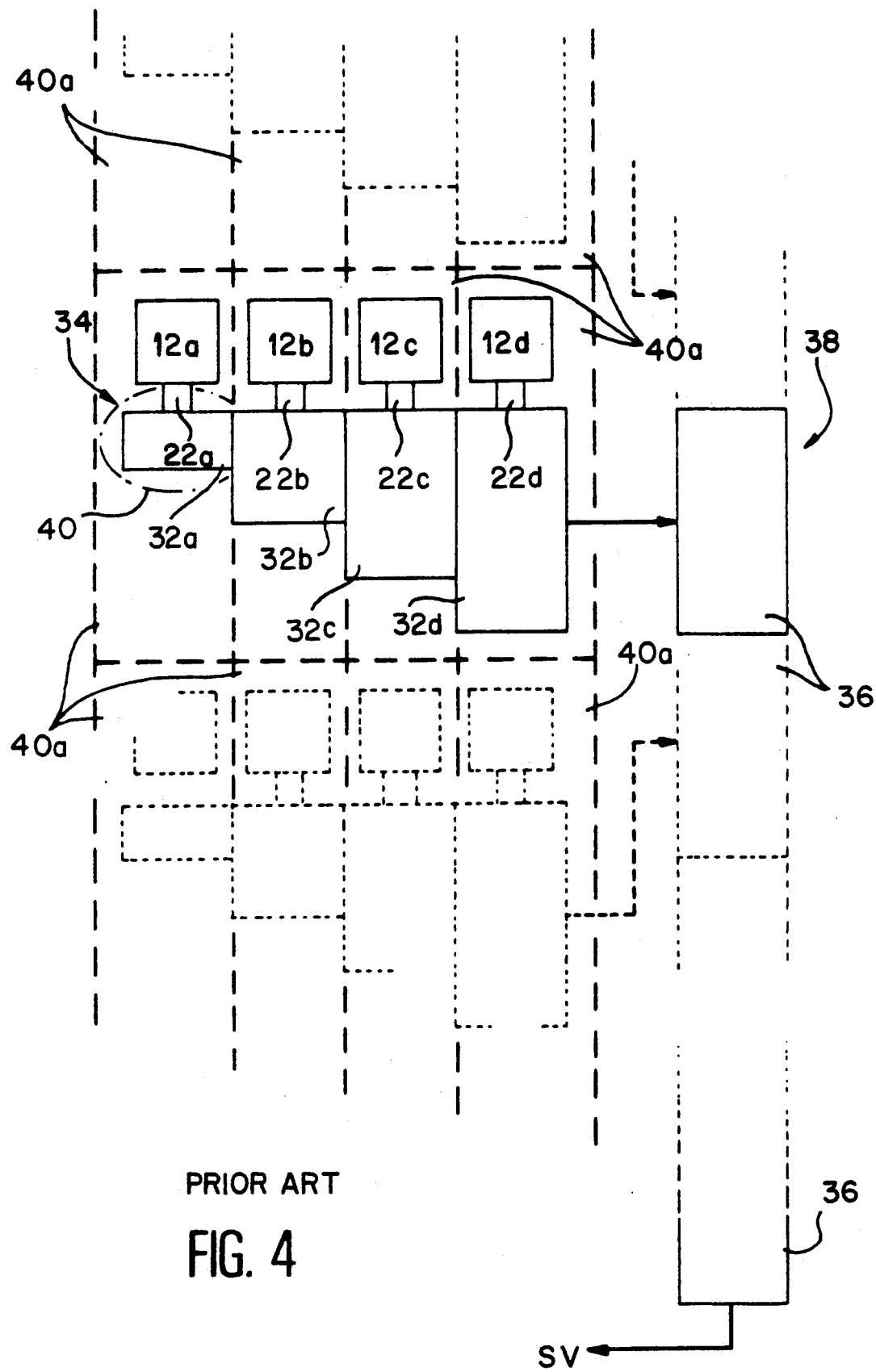

With reference to FIGS. 2, 3 and 4, a description will now be given of a camera with integrated scanning circuits in accordance with the prior art.

In known manner, an image to be recorded moves passed detectors arranged in an array and perpendicular to the columns. For each photograph, the detectors supply signals representing elements of the image having illuminated them. If a row comprises N detectors, at the end of N photographs, all the detectors in a row will have been traversed by the same image element.

The detectors of a row are interconnected by a column scanning circuit making it possible to collect and add together the signals representing the same image element during a movement.

A row scanning circuit connects the different column scanning circuits and ensures the multiplexing of the signals which they supply in order to form a signal representing a column of the image. Thus, the image is supplied column by column at the camera output.

The addition operation of the signals representative of the same image element corresponds to a mean value improving the signal-to-noise ratio.

In order to obtain a compact camera having a low energy consumption, the column and row scanning circuits are produced by CCD-type structures integrated onto the same substrate.

FIG. 2 is an overall view of such a known camera, whilst FIG. 3 is a part sectional view showing a detection means. A first substrate 10 transparent to the radiation to be detected (e.g. of CdTe for infrared detection) supports an array of detectors 12 arranged in row and column form.

A photosensitive layer 13 (e.g. of HgCdTe for infrared detection) covers one face of the substrate 10. The detectors 12 are constituted by P-N junctions included in the layer 13. Reference 14 corresponds to a contactor on a detector.

A second substrate facing the first substrate 10 carries electronic reading and scanning means constituted by CCD's. The semiconductor substrate 15, e.g. of silicon, is covered with an insulating layer 16, e.g. of $SiO_2$, within which are formed the electrodes 17,18,19,32 constituting the CCD gates. The gates 17,18,19 define three stages of the reading circuit 22 permitting the integration, during a given reading time, of the electrical signal supplied by the detector 12 under the effect of an illumination. Via the contactors 14 and 14', an indium ball 24 ensures the connection between the reading circuit 22 via a junction 11a formed in the layer 15 and the detector 12 located on a separate substrate. The gate 17 of the first stage of the reading circuit 22 forms the gate of a MOS transistor (whose source is constituted by the junction 11a and the drain by the depleted zone beneath the gate 18) and matches the impedance between the detector 12 and the capacitor formed by the second stage (gate 18). Integration is brought about by said second stage. The third stage (gate 19) functions as a switch, being open during integration and closed for supplying the integrated signal to the scanning circuit described hereinafter (the gate 32 represents one of the gates of the column scanning circuit). The various stages of the reading circuits are controlled by means of adequate potentials applied to the different gates 17, 18 and 19.

An optical system mainly constituted by a mirror 26 performing an alternating rotary movement by means of a motor 28 makes it possible to move an image 30 in translation on columns of detectors and perpendicular thereto. For example, a complete movement takes place every 40 ms in order to respect the conventional video signal production mode.

The operating procedure for such a means will be described in greater detail hereinafter with reference to FIG. 4 diagrammatically showing a row of detectors connected to its scanning circuits.

The row shown is formed by four detectors 12a, 12b, 12c and 12d. The column scanning circuit is constituted by a processor 34 performing a delay and summation function (processor referred to herinafter by the abbreviation TDI for time delay and integration). In such a device, the TDI processor is formed by CCD's, each CCD gate forming one stage of the processor.

Each detector 12a, 12b, 12c, 12d is connected to a stage 32a, 32b, 32c, 32d of the processor 34 across a reading circuit 22a, 22b, 22c, 22d, as described relative to FIG. 3. During the moving passed of an image the same number of photographs are taken (i.e. readings by the reading circuits 22a, 22b, 22c, 22d) as there are columns of detectors.

The shooting rate is synchronized with the movement speed of the image on the columns of detectors. A photograph is taken whenever one element of the image passes from one detector to another in the same row. Thus, an image can be broken down into the same number of elements as there are detection zones 40a, each detection zone having a detector 12 and a detection circuit 40, incorporating in the present construction a reading circuit 22 and a stage 32 of the TDI processor 34. Therefore the width of an image element corresponds to the width of the detection zones.

In FIG. 4 ff, is shown the detectors 12 in the same plane as the detection circuits 40 to facilitate understanding thereof. In reality and as can be seen in FIG. 3, the detectors are located above the detection circuits and are contiguous with one another, each detector being located on a complete detection zone 40a, the associated detection circuit being positioned beneath the detector in said zone.

When a photograph is taken, during the reading time each detector 12a, 12b, 12c, 12d supplies an electric signal integrated by the reading circuit 22a, 22b, 22c, 22d to which it is connected. At the end of reading, the signals read are recorded in the different stages 32a, 32b, 32c, 32d of the TDI processor 34 and added to the signals already present in said stages corresponding to preceding photographs. The signals then undergo a displacement towards the following stage (displacement to the right in the represented embodiment, the signal contained in the stage 32a being transferred into the stage 32b, that contained in the stage 32b being transferred into 32c and so on).

Therefore the TDI processor 34 makes it possible to add together the signals coming from the different detectors and representing the same element of the image which is moving passed.

In this way, prior to each photograph the stage 32a is empty. The stage 32b contains the signal recorded by the stage 32a during the last photograph and coming from the detector 12a. The stage 32c contains the signal recorded by the stage 32a during the penultimate photograph added to the signal recorded by the stage 32b during the last photograph. The stage 32d contains the sum of the signals from the stages 32a, 32b, 32c and respectively recorded during the two before the last, penultimate and last photographs.

Following each photograph, the stage 32d contains a signal corresponding to the sum of the signals produced by the different stages, each of the said signals being representative of the same element of the image which has moved passed the successive detectors 12a, 12b, 12c and 12d.

During the displacement, said sum signal is transferred from the stage 32d to a stage 36 of a multiplexer 38 supplying on an output SV in succession the sum signals coming from the different rows. The multiplexer 38 conventionally has a CCD structure and forms the row scanning circuit. Thus, for each photograph, the multiplexer 38 supplies a sequence of signals representing one column of the image 30.

The signals coming from each detector and representing the same element of the image are not all identical. Thus, the response of the two detectors to the same excitation has minor differences. In particular, the noise disturbing the signal supplied by each detector is not the same. However, the interfering noise from each of the detectors is decorrelated.

As a result of the summation of the different signals coming from the successive detectors belonging to the same row, the signal supplied at the output of the processor 34 is multiplied by a factor of 4 (said factor being equal to N for a row of N detectors), whereas the noise is only multiplied by a factor of 2 ($\sqrt{N}$ for a row of N detectors). The signal-to-noise ratio is consequently improved by a factor of 2 ($\sqrt{N}$ for a row of N detectors) compared with a means only having one column of detectors (one row only having a single detector).

Moreover, the linewise dispersion resulting from the fact that the detectors are not strictly identical is also averaged by the summation. For a row of N detectors the dispersion is attenuated by a factor $\sqrt{N}$ compared with a camera only having one column of detectors. However, this type of camera suffers from various disadvantages.

The sensitivity of the camera to interfering noise imposes the proximity of the processor 34 and the detectors 12a, 12b, 12c 12d, because the flow of the signals in noise-generating connections must be limited to the maximum.

Moreover, in order to obtain the best possible spatial resolution, a detection circuit 40 constituted by a reading circuit 22 and one stage 32 of the processor 34 must have overall dimensions equal to or smaller than the dimensions of a diffraction spot in the considered wavelength range, the associated detector having to cover the dimensions of the diffraction spot. In the case of an infrared image having an average wavelength of 12 micrometers, the diameter of a diffraction spot is approximately 35 micrometers. Therefore each detection circuit 40 must be contained within said dimensional limit.

However, it is known that the overall dimensions of a stage of the TDI processor increases in proportion with its capacity to receive a large number of electrical charges (signals supplied by the reading circuits). Thus, in the camera of FIG. 3, the stage 32b has double the surface of the stage 32a, stage 32c a triple surface, etc. The stage 32d has the largest surface, because it must be able to store the charges coming from each of the detectors.

It is therefore clear that respecting the overall dimensions in order to retain an optimum resolution linked with the obligation of positioning the processor in the vicinity of the detectors leads to a limitation in the number of successive stages of the TDI processor and therefore the number of detectors 12 forming a row (4 detectors per row in the prior art). The improvement of the S/N ratio, which is a function of the number of detectors, is consequently also limited.

Therefore the present invention relates to a camera with integrated scanning circuits accepting a very large number of columns of detectors and thus making it possible to summate a large number of signals representative of the same image element in order to obtain a signal representing the total image with an excellent S/N ratio, whilst respecting topographical criteria in order to maintain an optimum resolution.

Another aim of the invention is to supply a camera only having a low electricity consumption.

The invention also recommends the use of two image movement directions on the columns of detectors, which makes it possible to eliminate the dead time which would result from the return of the mirror to its initial position in the prior art cameras.

More specifically, the present invention relates to a camera having integrated scanning circuits comprising several detectors arranged in rows and columns, said detectors supplying an electrical signal proportional to their illumination; an optical system able to move an image in translation on columns of detectors perpendicular thereto; several reading circuits having a structure of the charge coupled device-type integrated beneath the detectors, each connected to a detector, each reading circuit being able to read the electrical signal supplied by the detector to which it is connected, in relation to the movement of the image and supplying a reading signal; for each row, a column scanning circuit having a CCD-type structure able to add the reading signals corresponding to the detection of the same element of the image successively moving over the detectors of the same row and supplying signals representative of the image having moved over all the detectors of a row; a row scanning circuit constituted by a row multiplexer having a CCD-type structure and having the same number of stages as there are rows of detectors, each stage being connected to a column scanning circuit, said multiplexer supplying a signal representing a column of the image formed by the different signals supplied by the column scanning circuits; characterized in that, as the optical system is able to move the image in one or two successive, opposite movement directions, the column scanning circuits are able to add the reading circuits corresponding to the detection of a same element of the image moving successively over the detectors of a same row and supply signals representative of the elements of the image having moved over all the detectors of the same row in one and/or the other direction, part of each scanning circuit being integrated beneath the detectors of the corresponding row and the other part being integrated next to said row with a spacing equal to or smaller than the spacing of the rows of detectors.

The topographical distribution of the different functions of the column scanning circuit makes it possible to have detection circuits (constituted in the case of the invention by reading circuits and by that part of the column scanning circuit integrated beneath the detectors) of an identical size to one another and equal to or less than the dimensional limit (e.g. 35 μm). Therefore the number of detectors for each row is not limited, the detectors of a same column also being substantially contiguous to avoid inactive detection zones. Moreover, as the remainder of each column scanning circuit is integrated next to detectors with a spacing equal to or less than the spacing of a row of detectors, the rows of detectors can be effectively contiguously positioned without blind areas. Moreover, several detection arrays (e.g. of 512 rows and 32 columns) can be contiguously assembled in order to obtain a very complex array (e.g. of 4096 rows and 32 columns) without any dead detection zone.

The term integrated circuit next to the detectors means an integrated circuit in the vicinity of the detectors, but not necessarily in the same plane. Thus, the column scanning circuits are integrated into the plane of the reading circuits.

According to an advantageous embodiment with N being the number of detectors forming a row, each column scanning circuit comprises:

a column multiplexer having N integrated stages beneath the detectors of the corresponding row, each stage being connected to a reading circuit, said multiplexer being able to record in its different stages the reading signals formed after a photograph and supply at a multiplexing output (SM) the said reading signals;

at least one processor integrated next to the detectors of the corresponding row for processing the signals supplied by the column multiplexer and performing a delay and summation function, said processor supplying on at least one output signals representative of the elements forming a row of the image, each of these signals being constituted by the sum of the signals corresponding to the same element of the image having moved passed all the detectors of a row;

for each processor, a control circuit connected to an output of the column multiplexer and to an input of the processor, said circuit being able to authorize or prevent a transfer of signals between said multiplexer and processor.

The control circuit is integrated beneath the detectors and/or next to the same.

According to a special embodiment, the processor has at least 2N stages subdivided into a central stage in which are carried out the summations linked with a first succession having at least N-1 stages and a second succession having at least N stages, the control circuit being connected to the said central stage.

According to a variant, the stages of each processor have an elongated strip form in accordance with the alignment of a row of detectors, the successions of stages being disposed on either side of the central stage perpendicular to the alignment of the row of detectors, but in the spacing of the rows of detectors.

According to a special embodiment of said variant, each processor has a switch with a CCD-type structure connecting the central stage to a stage of the row multiplexer.

According to another variant, the second succession has N+1 stages and the representative signals of the successive elements forming one row of the image are supplied at the output of one or other of the end stages of successions in relation to the image movement direction, said end stages being connected to one stage of the row multiplexer.

In an embodiment of said variant, the control circuit has a charge-voltage converter connected to the output (SM) of the column multiplexer and a voltage-charge converter connected to the central stage of the processor.

According to a variant, each processor is U-shaped, the two successions of stages forming the branches of the U being parallel to one another and next to (in preferred manner in the alignment) a row of detectors, the central stage forming the base of the U. In this preferred embodiment, the successions each have N+1 stages.

In this preferred embodiment, for each processor the end stages of the successions are connected to switches having a CCD-type structure, each of these switches being connected to the same stage of the row multiplexer.

According to a variant, the control circuit has a CCD-type structure with one stage and constitutes a switch. In this variant, in preferred manner, each stage of the processor is at least N times more extensive than a stage of the column multiplexer.

In another variant, the control circuit has a CCD-type structure with three stages, whereof one stage represents a capacitor of capacitance Cs and is connected to the output of the column multiplexer, another stage constitutes a capacitor of capacitance Cp and is connected to the central stage of the processor and another stage constitutes a switch, said control circuit forming a switch performing bottom leveling and partitioning functions of the charges from the column multiplexer.

In this variant, preferably each stage of the processor is at least $N(Cs/(Cs+Cp))$ times more extensive than a stage of the multiplexer.

The invention is described in greater detail hereinafter relative to non-limitative embodiments and the attached drawings, wherein show:

FIG. 1, already described, diagrammatically a sectional view of a CCD-type structure.

FIG. 2, already described, diagrammatically an overall view of a camera according to the prior art.

FIG. 3, already described, diagrammatically a part sectional view of the preceding camera.

FIG. 4, already described, diagrammatically a row of detectors connected to prior art scanning systems.

Figure 5:
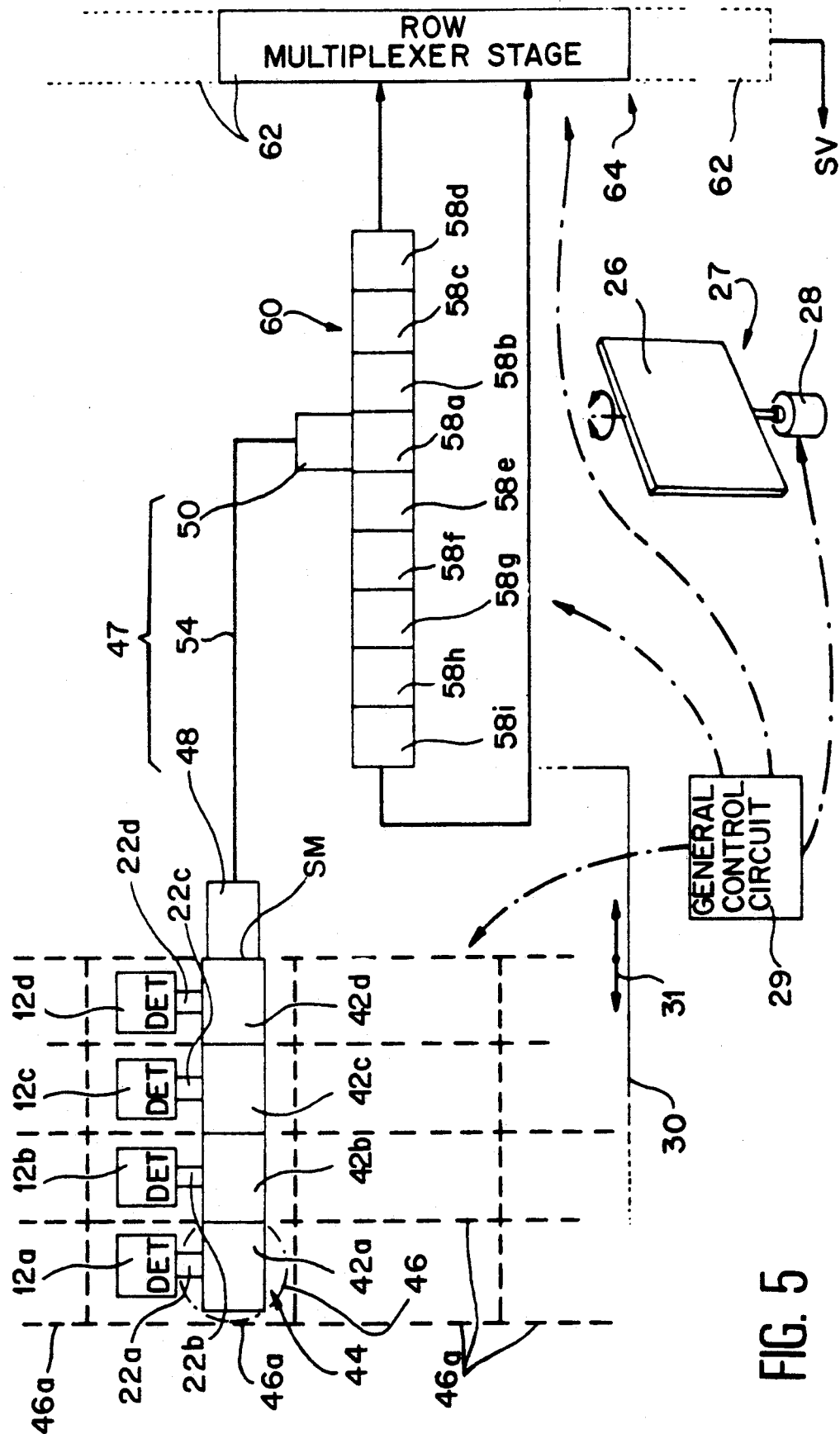

FIG. 5 diagrammatically a partial view of a first variant of a camera according to the invention.

Figure 6:
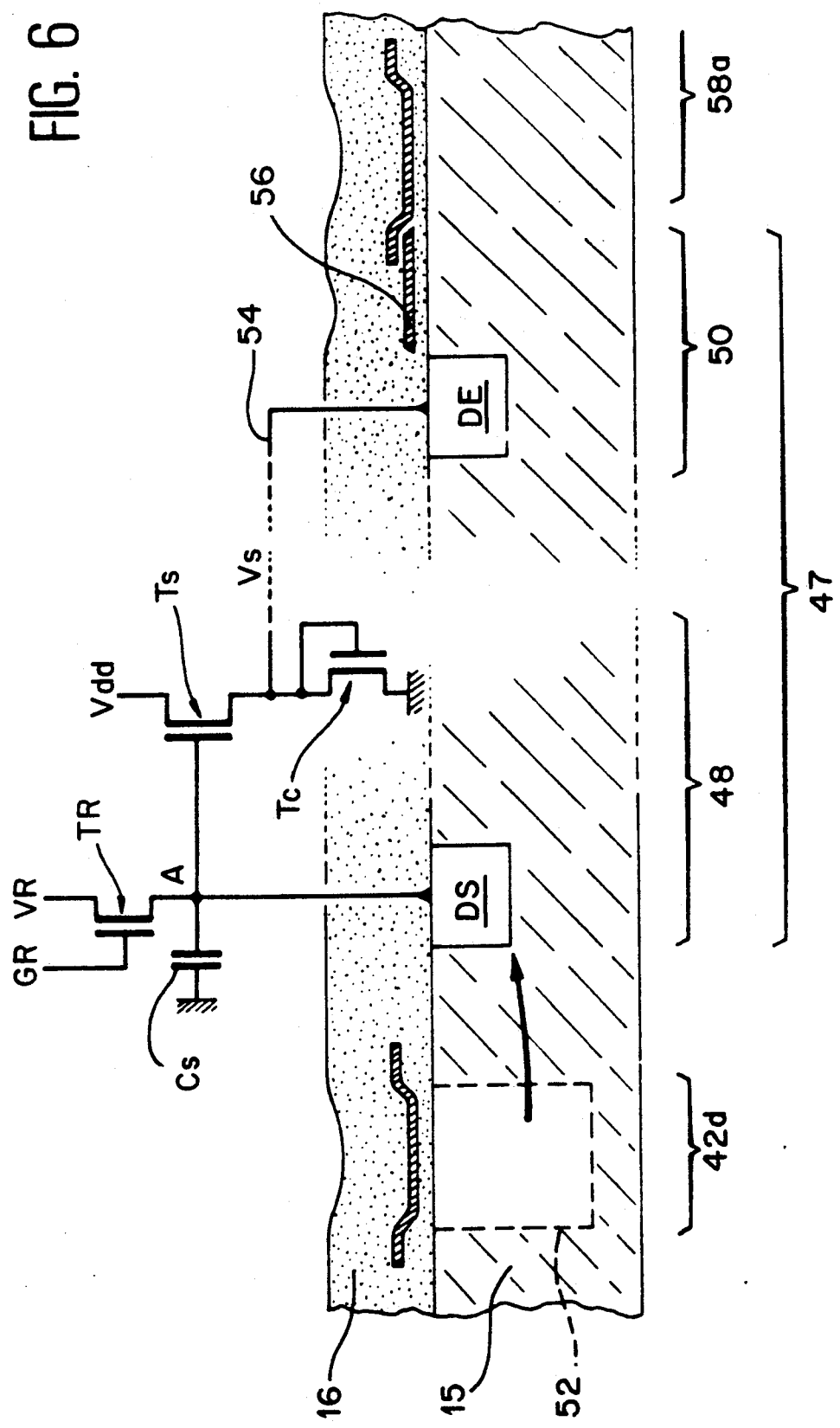

FIG. 6 diagrammatically a means performing a double charge-voltage and then voltage-charge conversion used in the first variant.

Figure 7A:
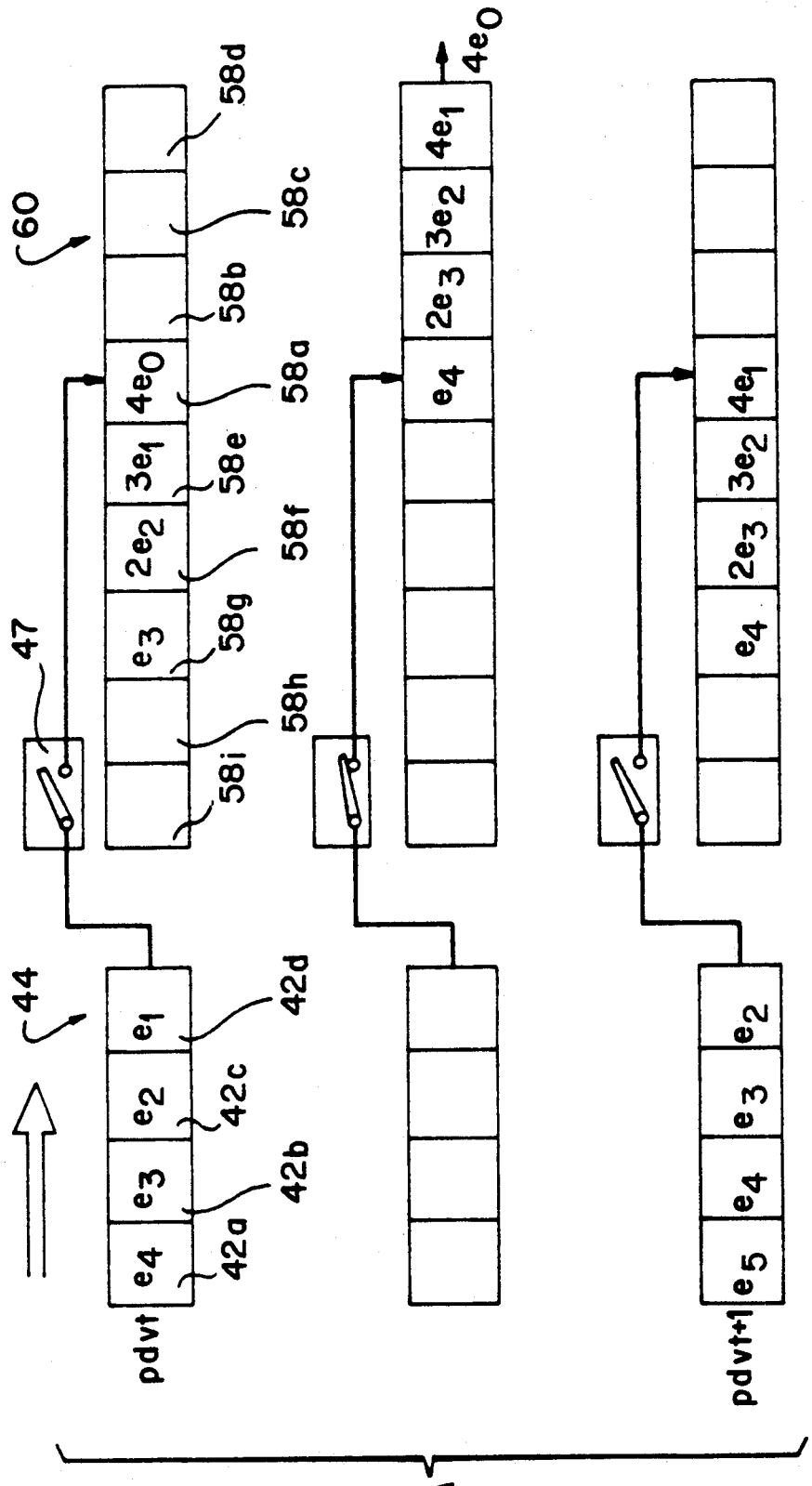
Figure 7B:
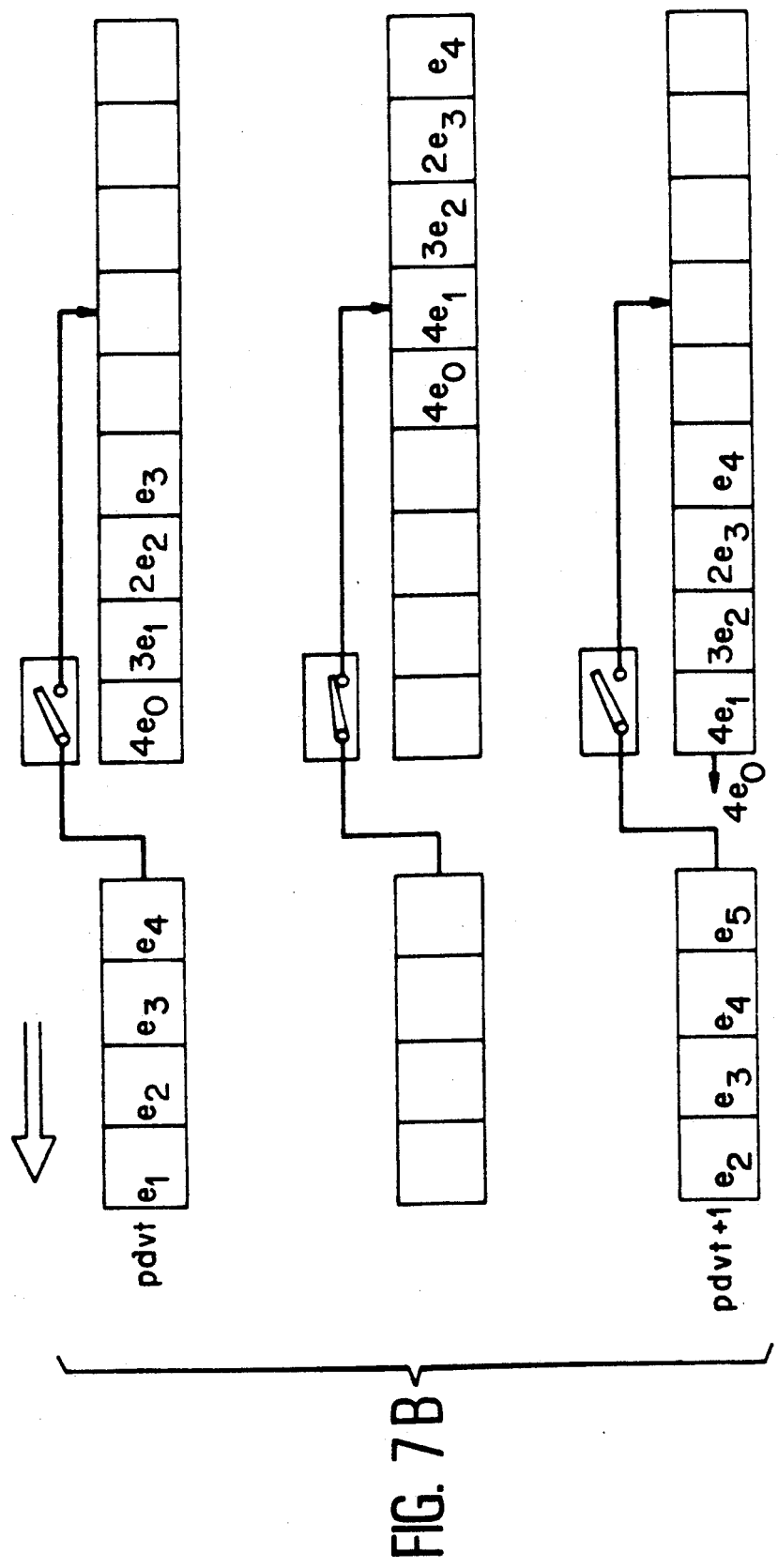

FIGS. 7A and 7B diagrammatically the operation of a column scanning circuit for a camera according to the first variant, in two movement directions.

Figure 8:
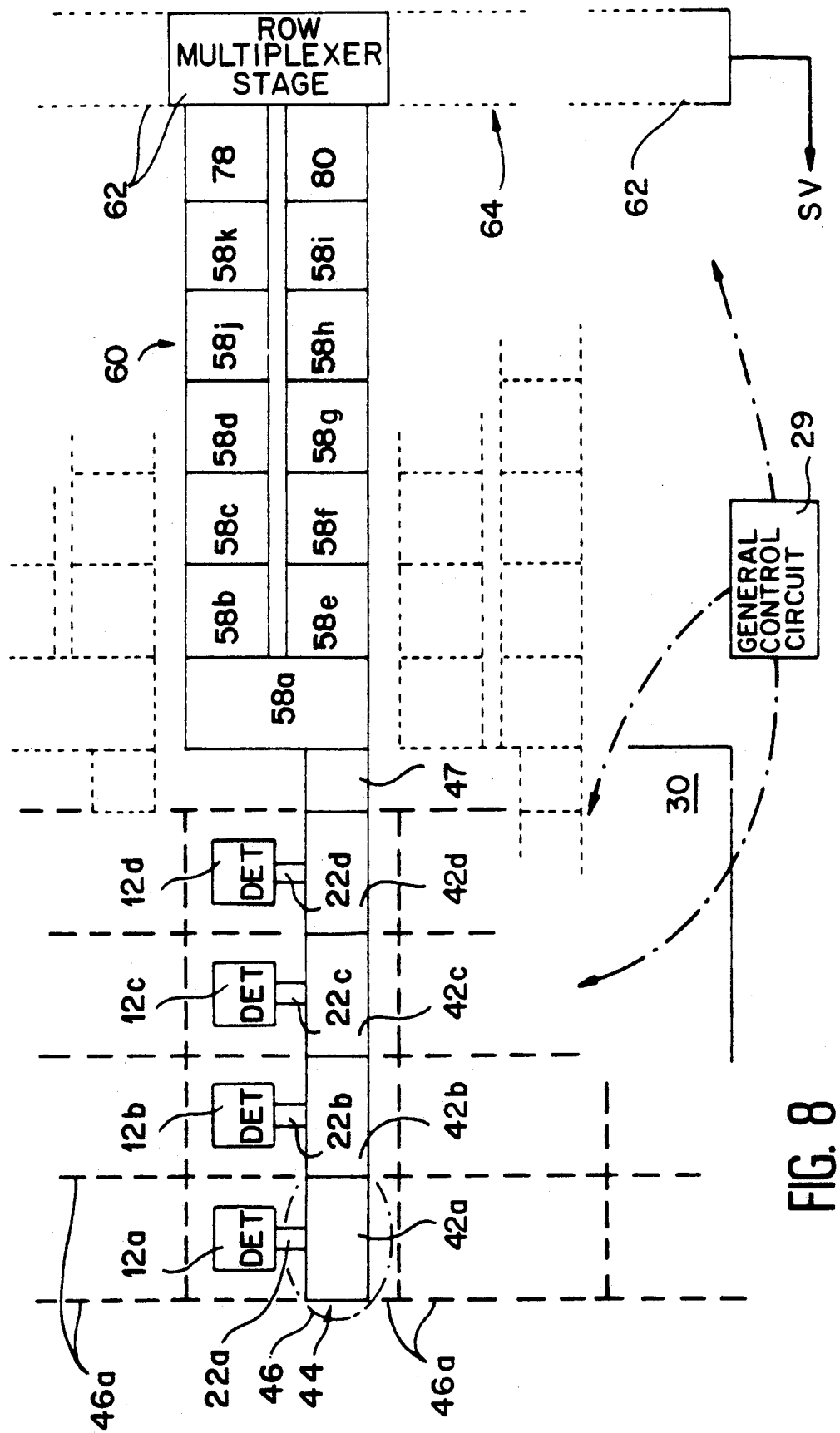

FIG. 8 diagrammatically a partial view of a second variant of the camera according to the invention.

Figure 9:
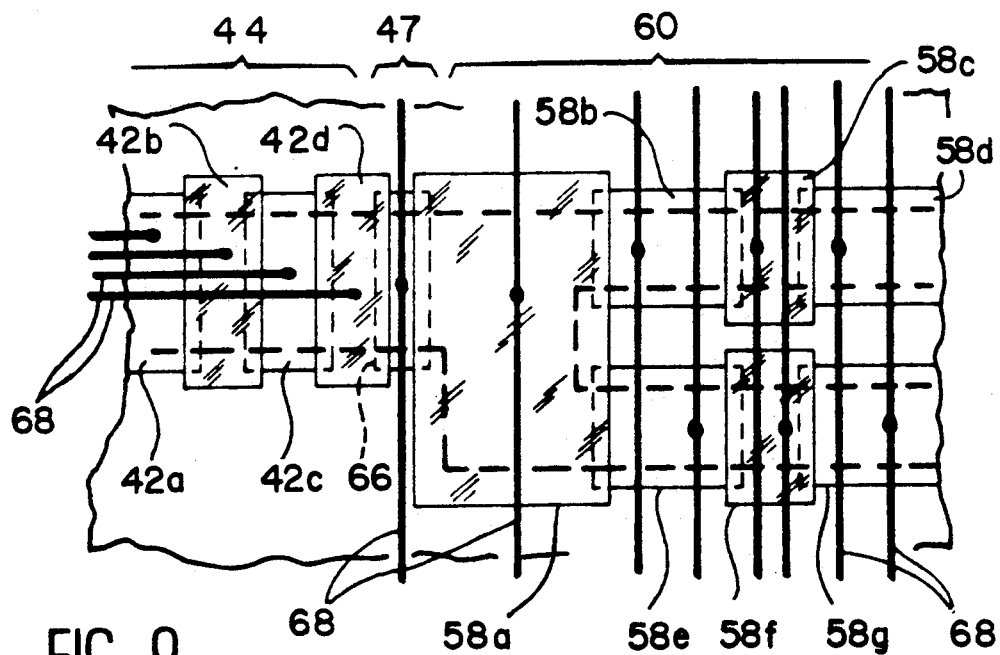

FIG. 9 diagrammatically a first embodiment of a control circuit.

Figure 10:
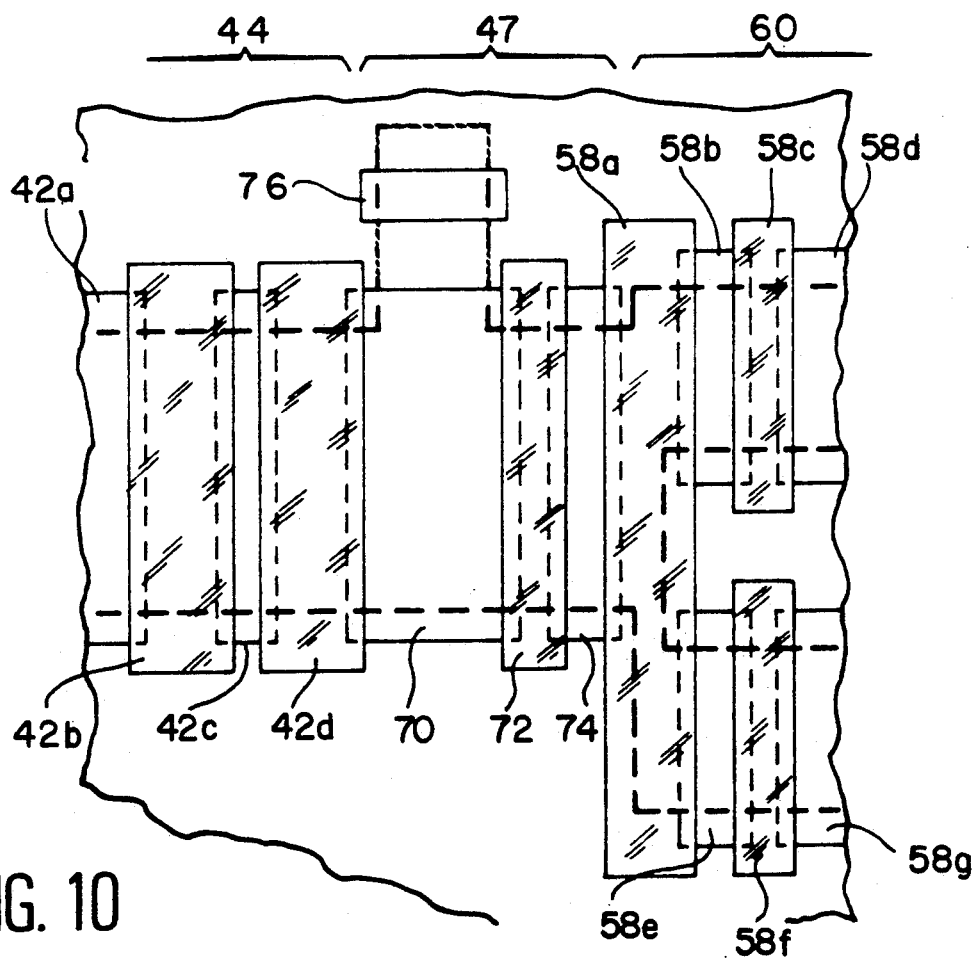

FIG. 10 diagrammatically a second embodiment of a control circuit.

Figure 11:
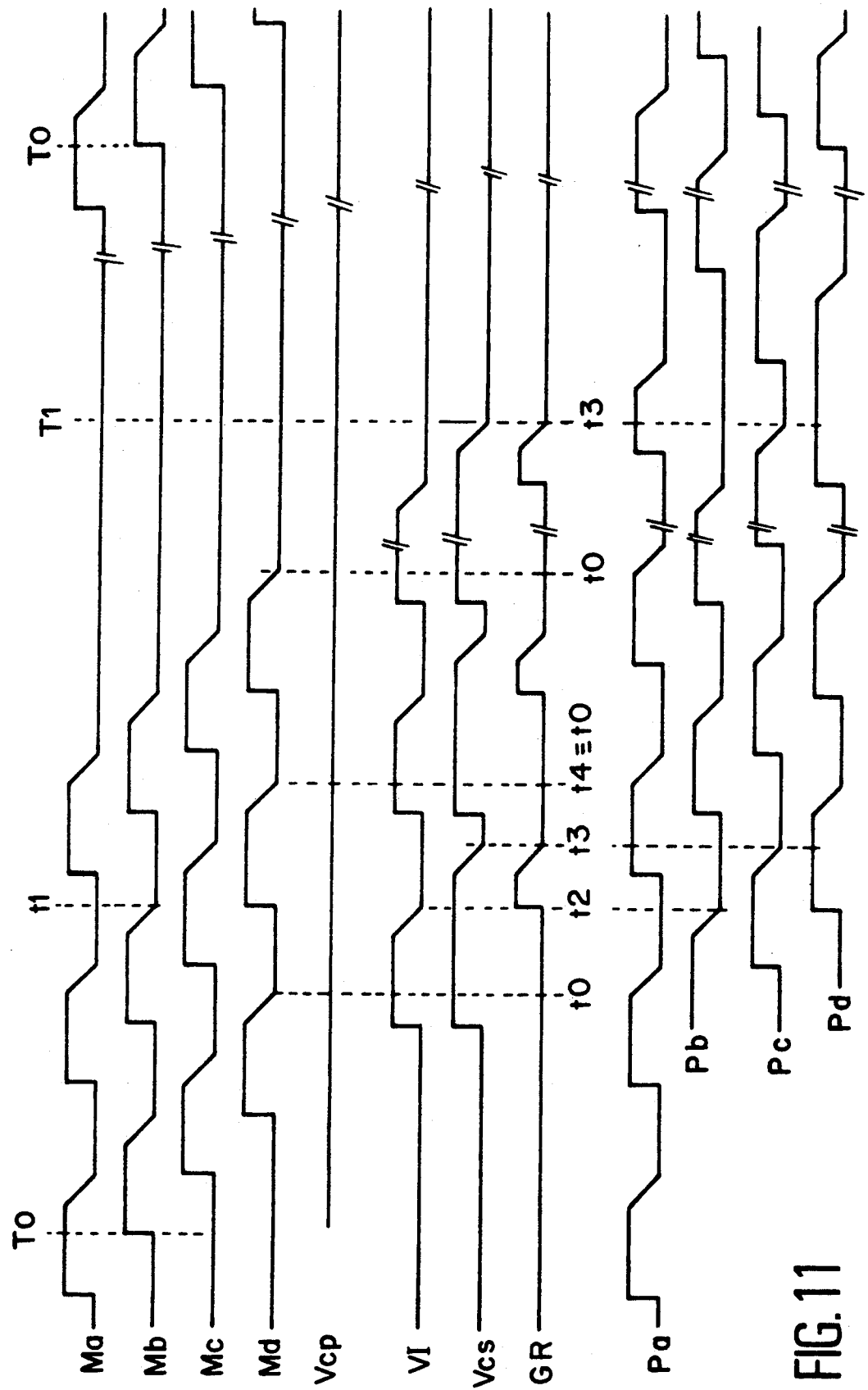

FIG. 11 diagrammatically the control potentials permitting the different transfers of signals between the stages of the multiplexer and the processor.

Figure 12:
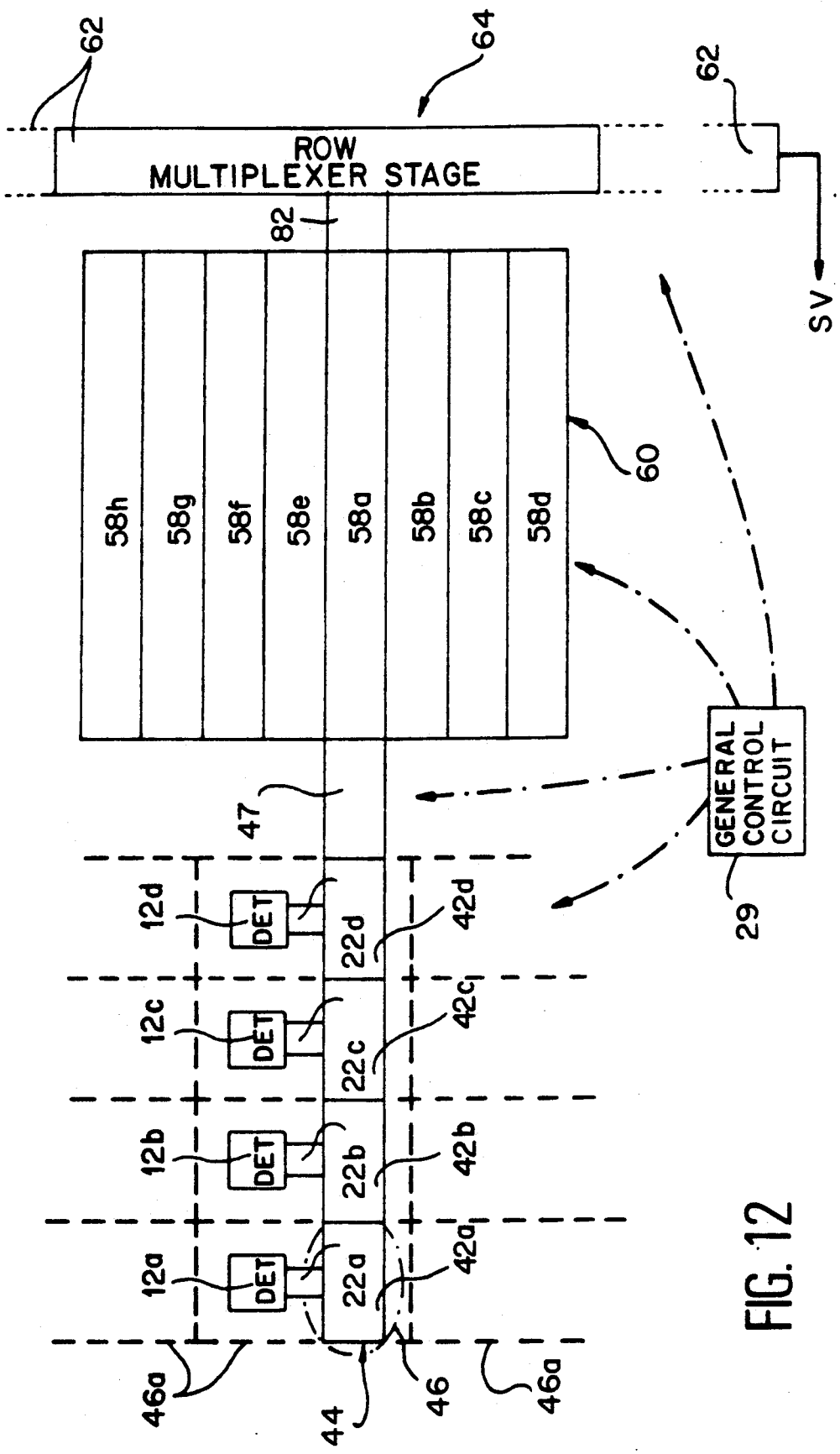

FIG. 12 diagrammatically a partial view of a third variant of a camera according to the invention.

FIG. 5 diagrammatically and partially shows a camera with integrated scanning circuits according to the invention. The detectors are arranged in rows and columns. They are supported by a first, not shown substrate and connected to reading and scanning circuits integrated on a second, not shown substrate. For the clarity of the description in the present embodiment, a row of detectors is constituted by four detectors 12a,12b,12c,12d, but this quantity is not limitative. For illustrative purposes, a camera according to the invention can e.g. have 512 rows of 32 detectors.

An optical system 27 mainly constituted by a mirror 26 rotated in two alternating directions by a motor 28 enable an image 30 to move in translation over columns of detectors, perpendicular thereto and in two successive, opposite movement directions. Optionally, a not shown focussing optics makes it possible to adjust the dimensions of the image 30 to those of the array of detectors. A double arrow 31 symbolizes the two movement directions of the image 30.

The detectors 12a,12b,12c,12d of a row are respectively connected to the reading circuits 22a,22b,22c,22d.

The reading circuits of a row are connected to the column scanning circuit. According to the invention, for each row, the latter adds the reading signals corresponding to the detection of the same element of the image having successively moved passed the detectors of the row in one or other direction and supplies summated signals representative of successive elements forming a row of the image.

A row scanning circuit supplies a signal representative of each image having moved passed the detectors in one or other direction from signals supplied by the column scanning circuits.

The complete circuitry, i.e. the different elements integrated onto the second substrate is advantageously constructed on the basis of a CCD-type structure. A general control circuit 29, connected to the gates of the different elements makes it possible to apply adequate potentials for the operation of the camera.

Each column scanning circuit has a multiplexer 44, a TDI processor 60 performing a delay and summation function, and a control circuit 47 connected to the output of the multiplexer 44 and to an input of the processor 60.

For each row, the reading circuits 22a,22b,22c, 22d are respectively connected to the stages 42a,42b,42c,42d of the multiplexer 44, the latter having at least the same number of stages as there are detectors.

A reading circuit and a multiplexer stage form a detection circuit 46 having reduced overall dimensions compared with the detection circuits of the prior art cameras. Each detection circuit is integrated into a detection zone 46a, beneath the detector 12 associated therewith.

As the stages of the multiplexers only have to receive the charges coming from a single detector at the same time, they all have an identical surface and which does not limit the installation of a large number of detectors on a row, whilst respecting the optimum resolution criteria.

No matter what the movement direction of the image 30 during each shooting, the signals supplied by the detectors 12a,12b, 12c,12d are recorded by the corresponding stages 42a,42b,42c, 42d of the multiplexer 44. These signals are then multiplexed on the output SM of the multiplexer 44 and are transferred to the processor 60 performing a delay and summation function (TDI processor) via a control circuit 47 able to authorize or prevent a transfer of signals between the multiplexer 44 and the processor 60.

In this variant, the control circuit 47 comprises a charge-voltage converter 48 connected by a connection 54 to a voltage-charge converter 50.

FIG. 6 diagrammatically shows an embodiment of such converters. The charges contained in the depleted zone 52 of the final stage 42d of the multiplexer are transferred into a diffusion means DS under the action of an adequate control potential applied to the gate of said stage. The diffusion means DS is obtained by the local diffusion or implantation of impurities in the layer 15, so as to obtain a diode.

To the point A are connected by connection lines the diffusion means DS, a capacitor CS, which is connected to earth or ground, and two TMOS transistors TR and TS permitting an impedance matching between the diffusion means DS and a diffusion means DE. TS is permanently supplied at a potential Vdd, whereas TR is supplied by a potential VR and controlled by a potential GR applied to its gate. A voltage VS proportional to the charge variation is CS is supplied by the source of TS. A third TMOS transistor TC serves as an ohmic charge and is connected to the source of TS.

The transistors TR, TS and TC, as well as CS constitute a conventional output stage of a charge coupled device, whereof FIG. 6 gives an electrical representation. The means TS and TC constitutes a gain follower stage close to 1.

By means of a connection 54, the voltage VS is applied to the diffusion means DE in layer 15. The gate 56 in layer 16 defines a stage functioning as a switch controlled by the application of an adequate potential.

The diffusion means DE and the stage, defined by the gate 56, associated with the input stage 58a of the processor form the voltage-charge converter 50. The diffusion means DS and the output stage (TR,TS,TC,CS) form the charge-voltage converter 48.

As will be shown hereinafter, the charges produced by the converter 50 are stored in the stage 58a of a processor 60 performing delay and summation functions.

As the gate of the stage 58a is correctly polarized, the switch associated with the gate 56 is then closed. The surface potential beneath the gate of the stage 58 is imposed by the potential VS of the diffusion means DE and when the switch is opened again, the quantity of charges stored in the stage 58a is proportional to VS.

In this arrangement, TR functions as a switch and, under the action of the control GR, allows the repolarization or reinitialization of CS to potential VR after the voltage variation associated with the inflow of charges from the multiplexer has been taken into account by the switch associated with the gate 56.

The converters 48 and 50 are produced in technologies permitting their integration on the semiconductor substrate 15.

The double conversion permits the transfer of signals from the multiplexer to the processor under optimum conditions. Thus, a simple conduction of the charge of DS to DE by a metallic connection would excessively disturb the signals transferred through the introduction of parasitic noise.

With reference to FIG. 5 a description will now be given of the scanning of the charges produced by the detectors 12a,12b, 12c,12d of a row. Once supplied by the reading circuits 22a to 22d to the stages 42a to 42d respectively of the multiplexer 44, the reading signals are multiplexed at the multiplexer output SM. The control circuit 47 functioning as a closed switch and carrying out a double charge-voltage and voltage-charge conversion permits their transfer into the stage 58a of the processor 60. The processor 60 has a CCD-type structure and, in the represented embodiment, comprises 9 stages. For a row of N detectors, the processor 60 will have 2N+1 stages.

The processor stages are distributed into a first succession of three stages (N−1 for a row of N detectors) 58b, 58c,58d and into a second succession of five stages 58e,58f, 58g,58h,58i (N+1 for a row of N detectors) connected to a central stage 58a. As will be shown hereinafter, the summation operations are performed in the central stage 58a.

The overall dimensions of each stage of the processor 60 are the same, the surface of its gates being four times (N times for a row of N detectors) that of a gate of the multiplexer 44. The processor 60 is controlled by adequate control potentials applied to the gates of the different stages 58a to 58i.

The operations performed by the processor 60 are dependent on the direction of movement of the image 30 passed the columns of detectors.

The operation of the camera of FIG. 5 will be better understood by referring to FIGS. 7A and 7B diagrammatically representing the filling over a period of time of the multiplexer 44 and the stages of the processor 60.

FIG. 7A shows the successive stages of the multiplexer 44 and the processor 60 when the image passes from the detector 12a to the detector 12d. The movement direction is indicated by an arrow in the outward direction.

Following a photograph designated pdvt, the stages of the multiplexer 44 are filled with the signals e1,e2,e3,e4 representative of the image elements, the latter having been respectively detected by the detectors 12d,12c,12b,12a. During shooting, the control circuit 47 functions as an open switch.

The stage 58g of the processor 60 contains a signal which is also designated e3, because it represents the same image element as that detected by the detector 12b at the time pdvt. This signal was recorded during the preceding photograph and results from the detection carried out by the detector 12a.

The stage 58f contains the signal designated 2e2, which constitutes the sum of the signals e2 representative of the elements of the image recorded during two preceding photographs and obtained from the detectors 12a and 12b. In accordance with the same notation, the stages 58e and 58a contain the signals 3e1 and 4e0.

During the multiplexing operation, the circuit 47 functions as a closed switch. The signals e1 to e4 are transferred by four successive displacements (N displacements for N detectors) into stages 58a to 58d of the processor 60. The signals contained in the processor 60 are synchronously displaced in such a way that for each passage of one of the signals e3, 2e2, 3e1 through the stage 58a, the latter is added to the signal (respectively e3,e2,e1) representing the same element of the image coming from the multiplexer.

The signal 4e0, which is the sum of four signals representing the image element having moved passed all the detectors of the row in question, is supplied to the exterior of the processor 60 at the output of the stage 58d.

The control circuit 47 then functions as an open switch and the following photograph pdvt+1 is performed, together with the filling of the multiplexer with the signals representing the detected image elements. For the shooting time, the signals e4,2e3,3e2,4e1 undergo three displacements (N−1 displacements if there are N detectors), so as to respectively occupy the stages 58g,58f,58e and 58a of the processor 60. These successive stages are repeated during the complete movement of the image in the outward direction.

FIG. 7B represents the state of the multiplexer 44 and the processor 60 when the image passes from the detector 12d to the detector 12a. The movement direction is indicated by an arrow and represents the return direction.

Two successive photographs are indicated and are designated as hereinbefore pdvt and pdvt+1.

During the photograph pdvt and the filling of the stages of the multiplexer 44 with the signals e1,e2,e3,e4 representative of the image elements detected by the respective detectors 12a to 12d, the signals 4e0,3e1,2e2,e3 are respectively positioned in the stages 58i,58h,58g and 58f of the processor 60.

During multiplexing and four successive displacements (N displacements for a row of N detectors) of the signals contained in the multiplexer and those contained in the processor, the addition of the representative signals of said same image elements takes place in the stage 58a. At the end of multiplexing, the signals are positioned in the stages 58e, 58a,58b, 58c,58d.

During the photograph pdvt+1 and the filling of the stages of the multiplexer 44 with the representative signals of the image elements e5,e4,e3,e2, the signals contained in the processor 60 undergo five displacements (N+1 displacements for a row of N detectors) in order to fill the stages 58*i* to 58*f*. During this operation, the signal 4e0 is supplied at the output of the stage 58*i*.

These operations are repeated throughout the return movement of the image.

Once again with reference to FIG. 5, it can be seen that the stages 58*i* and 58*d* of the processor 60 are connected to a stage 62 of a row multiplexer 64. Each of these connections is ensured either by means of a double charge-voltage and voltage-charge conversion of the same type as the converter 47, in the case of a long connection (particularly for stage 58*i* in the case of FIG. 5) or by means of a switch of the same type as the switchs 78 and 80 described relative to FIG. 8 for the end stages adjacent to the multiplexer 64 (particularly for stage 58*d* in FIG. 5).

In accordance with the outward or return image movement for each shot, each stage 58*d* or 58*i* of the processor 60 associated with the different rows supplies a signal constituted by the sum of the signals representing an element of the image having passed over all the detectors of a row. This signal is recorded in a stage of the row multiplexer 64.

The various signals are then multiplexed at the output SV of the row multiplexer 64, which thus supplies for each photograph a signal representing a column of the image having moved passed the detectors.

FIG. 8 diagrammatically shows in a partial view another variant of the camera according to the invention. In non-limitative manner, said camera only has four columns of detectors in order to simplify the description. The detection circuits 46 are identical to those of the first variant.

In this case the processor 60 is U-shaped and has eleven stages (2N+3 stages for a row of N detectors) subdivided into a central stage 58*a* in which take place the additions and two successions of five stages (N+1 stages for a row of N detectors) respectively 58*b*,58*c*,58*d*,58*j*,58*k* and 58*e*,58*f*,58*g*,58*h*,58*i*. In general terms, the circuit 29 controls the gates of CCD-type means via not shown control lines, each control line being connected to several CCD gates. For example, for a four-phase CCD, four control lines are necessary, each line being connected to one out of every four gates of the CCD. Thus, in FIG. 8, the stages 58*a*,58*h*,58*j* are controlled by the same line.

The central stage 58*a* forms the base of the U, to which are connected the two successions, which form the branches of the U, which are parallel to one another and juxtaposed and preferably located in the extension of the row of detectors. Thus, the processor 60 does not project beyond the vertical spacing of the detection zone.

In this construction, the output stages 58*i* and 58*k* are connected via switches 80 and 78 to a stage 62 of the row multiplexer 64.

The addition of stages 58*j* and 58*k* compared with the previous construction makes it possible to symmetrize the number of stages of each branch of the U for topographical reasons. No supplementary noise source-forming metallic connection is required.

The opening and closing of the switches 78,80 are a function of the movement direction of the image 30 on the columns of detectors.

As is apparent from the remainder of the description, the surface of the stages is dependent on the embodiment of the control circuit 47.

FIG. 9 diagrammatically shows a first embodiment of the control circuit 47 used in this variant. In this version, the control circuit 47, which has a CCD-type structure, only has a single stage.

It is only possible to see in this view the gates 42*a*,42*b*,42*c*,42*d* of the multiplexer 44, the gate 66 corresponding to the stage of the control circuit, the gates 58*a*,58*b*,58*c*,58*d*,58*e*, 58*f*,58*g* of the processor 60 and the connection 68 connecting the different gates to the general control circuit 29. The latter are e.g. made from aluminium.

In this construction, the control circuit 47 only carries out an open or closed switch function in accordance with the control potential applied to the gate 66. It is able to record and transfer into the stage 58*a* of the processor 60, the electrical charges supplied by the stage 42*d* of the multiplexer 44.

The diagram of FIG. 9 is not to scale. Thus, in this configuration the processor gates have a surface at least four times larger (N times larger for a row of N detectors) than the surface of a gate of the multiplexer.

FIG. 10 diagrammatically shows a second embodiment of the control circuit 47 performing the bottom leveling and partitioning functions used in the variant of FIG. 8. In this version, the control circuit 47 has a CCD-type structure, so that it has three stages defined by the gates 70,72,74.

The first stage (gate 70) constitutes a first capacitor of capacitance $C_p$, the second gate (gate 72) constitutes a switch and the third stage (gate 74) constitutes a second capacitor of capacitance $C_S$. This assembly makes it possible to only deliver to the stage 58*a* a fraction $C_s/(C_p+C_s)$ of the quantity of charges coming from the stage 42*d*. In this way, the surface of the gates of the processor 60 can be reduced to $N(C_s/(C_p+C_s))$ times the surface of a gate of the multiplexer 44, when a row comprises N detectors.

The control circuit also comprises a gate 76 constituting a transistor, whose not shown source is permanently polarized to a potential VR and whose gate 76 is subject to a potential GR permitting a reinitialization, i.e. the bringing to the potential VR of the first capacitor following the transfer of charges into the stage 58*a*.

This construction has no metallic connection and does not require a double charge-voltage and voltage-charge conversion. Therefore two important noise sources are eliminated. Furthermore, it makes it possible to reduce electrical consumption compared with the constructions with double conversion.

When the image moves in the outward direction, the switch 28 is closed whereas the switch 80 is open. As a result of taking a photograph, the signals contained in the stages of the multiplexer 44 and the processor 60 undergo four displacements (N displacements for a row of N detectors) making it possible to empty the multiplexer 44 and to carry out the addition operations for the passage of the stage 58*a* of the processor.

At the end of these four displacements, the signals contained in the processor 60 undergo two supplementary displacements, which has the effect of making it possible to deliver to the stage 62 of the multiplexer 64 (cf. FIG. 8) by the stage 58*k* the signal constituted by the sum of the signals representing an element of the image having moved passed all the columns of detectors.

The signals contained in the processor 60 then undergo five displacements in the reverse direction (N+1 for a row of N detectors) for filling the stages 58*a*,58*e*,58*f*,58*g*. These five displacements are carried out during the following shooting in order to eliminate any dead time.

When the image moves in the reverse direction, the switch 80 is closed and the switch 78 open. As a result of taking a photograph, the signals contained in the stages of the multiplexer 44 and the processor 60 undergo four displacements (N for a row of N detectors).

At the end of these four displacements, the signals contained in the processor 60 undergo five displacements in the reverse direction (N+1 for a row of N detectors) for filling the stages 58f,58g,58h,58i. The signal to be delivered is delivered by stage 58i. This second series of displacements is carried out during the following shooting.

The embodiment of the camera incorporating the three-stage control circuit 47 will be better understood by referring to FIG. 11, which diagrammatically shows a sequence of potentials applied to the different gates following shooting in order to obtain the transfer and the addition of a signal to stage 58a.

Ma,Mb,Mc,Md are the potentials applied to the gates 42a,42b, 42c,42d of the multiplexer 44. VCp,VI,VCs and GR are the potentials applied to the gates 70,72,74 and 76 of the control circuit 47. Pa,Pb,Pc,Pd are the potentials applied to the gates 58a,58b,58c,58d of the processor 60 (the gates 58i and 58k being controlled in the manner described hereinbefore together with 58a and 58b).

In this embodiment, the gates are activated for positive values of the signals. At time T0, the charges from the reading circuits 22 are injected into the stages of the multiplexer 44. At time t0, the charges contained in the stage 42d are injected into the control circuit 47. At time t1, the charges contained in the final gate 58k are injected into a stage 62 of the multiplexer 64 across the stage 78 (cf. FIG. 8).

Simultaneously, at time t2=t1, the partitioning operation is performed by isolating the gate 74 from the remainder of the control circuit 47.

At time t3, the first capacitor of the circuit 47 (gate 70) is reinitialized and the charges contained in the second capacitor (gate 74) are transferred into the stage 58a. At time t4, the charges are advanced by a stage into the multiplexer 44 and into the processor 60, t4 corresponding to the time t0 of a new sequence permitting the progression of the charges by one stage.

At time T1, all the summations have been carried out and the movement direction of the charges in the processor 60 is reversed by modifying the wave shapes of the controls of the processor 60. Between T1 and T0, the reverse direction displacements are performed in the processor 60.

As from T1 and up to the following time T0, the circuit 29 freezes the control signals of the multiplexer 44 and the control circuit 47, said circuits remaining in their preceding state. The cycle is finished when the following time T0 appears.

FIG. 12 diagrammatically shows a partial view of a third variant of a camera according to the invention.

The stages of the processor 60 have an elongated band or strip shape in the alignment of a row. The stages forming the two successions are arranged parallel to one another and perpendicular to the alignment of the row, on either side of the central stage 58a.

For ease of representation, these stages project beyond the spacing of the detection zone 46a but, as has been shown hereinbefore, the processor 60 is contained in the spacing of the rows of detectors in order to avoid blind zones.

The first succession has three stages 58b,58c,58d (N−1 stages for a row of N detectors), whilst the second succession has four stages 58e,58f,58g,58h (N stages for a row of N detectors).

The transfers of signals take place in the same way as in the first variant. However, the signal is supplied by the central stage 58a as a result of the three rearward displacements in the processor 60 for a movement of the image in the outward direction and as a result of four displacements synchronous with the transfers from the multiplexer 44 for a movement in the reverse direction.

A switch 82 in the form of a CCD structure with one stage permits the transfer of the output signal to one stage 62 of the multiplexer 64.

The gates of each of the stages of the processor 60 have in this embodiment a surface equal to N times the surface of a gate of one multiplexer stage (for a row of N detectors) in the case of a one-stage control circuit 47. These gates have a surface equal to N(Cs/(Cs+Cp)) times the surface of a gate of a multiplexer stage for a three-stage control circuit.

The displacement of the TDI processors outside the detection zones makes it possible to reduce the overall dimensions of the detection circuits and consequently to have a large number of detectors in one row. The signals, constituting the sum of the signals representing an element of the image having moved passed all the detectors of a row, consequently have an improved S/N ratio.

Moreover, the photographs taken during the movement of the image in each of the movement directions gives photographs without any dead time. Moreover, the use of processors respecting the spacing of the rows of detectors means that there is no need to be limited with regards to the number of detectors for the columns and in particular makes it possible to combine several detector arrays.

The invention is obviously not limited to the embodiments described hereinbefore and in fact covers all variants thereof.

We claim:

1. Camera having integrated scanning circuits comprising a plurality of detectors arranged in the form of rows and columns, said detectors supplying an electrical signal proportional to their illumination, N being the number of detectors forming a row; an optical system able to move an image translation passed;
said columns of detectors and perpendicular thereto, said optical system being able to move the image in one or two successive, opposite movement directions; a plurality of reading circuits, each having a charge couple device integrated beneath the detectors and each charge couple device being connected to one detector, respectively, each reading circuit being able to read the electrical signal supplied by its respective detector, in relation with the movement of the image and supplying a reading signal; a row scanning circuit coupled to said reading circuits and including a row multiplexer having a CCD-type structure and having the same number of first stages as there are rows of detectors, each first stage being connected to a column scanning circuit, said row multiplexer supplying a signal representing a column of the image formed by the different signals supplied by column scanning circuits; for each row, one column scanning circuit having a CCD-type structure, said column scanning circuits being able to add the reading signals corresponding to the detection of the same element of the image moving successively passed the detectors of the same row and supplying signals representative of the elements of the image (30) having passed over all the detectors (12) of a row; the column scanning circuits being able to add the reading signals corresponding to the detection of the same element of the image moving successively passed the detectors (12) of a same row and supplying signals representing the elements of the image having passed all the detectors of a same row in one and/or the other direction, one part of each scanning circuit being integrated beneath the detectors of the corresponding row and the other part being integrated next to the said row with a spacing equal to or smaller than the spacing of the detector rows; each column scanning circuit comprising: a column multiplexer have N second stages integrated beneath the detectors of the corresponding row, each second stage being connected to a reading circuit, said column multiplexer being able to record in its different second stages the reading signals formed after a photograph and to supply, on a multiplexing output, integrated next to the detectors of the corresponding row in order to process the signals supplied by said column multiplexer and performing a delay and summation function, said processor supplying, on at least one output, signals representing elements forming a row of the image, each of these signals being constituted by the sum of the signals corresponding to the same element of the image having moved passed all the detectors of a row; for each processor, a control circuit connected to an output of said column multiplexer and to an input of said processor, said control circuit being able to allow or prevent a transfer of signals between the said column multiplexer and said processor (60).

2. Camera according to claim 1, wherein each processor has at least 2N stages subdivided into a central stage in which are carried out the summations linked with a first succession having at least $N-1$ stages and a second succession having at least N stages, the control circuit being connected to said central stage.

3. Camera according to claim 2, wherein the stages of each processor have an elongated strip shape in accordance with the alignment of a row of detectors, the successions of stages being located on either side of the central stage perpendicular to the alignment of the row of detectors, but in the spacing of the rows of detectors.

4. Camera according to claim 3, wherein for each processor a switch having a CCD-type structure connects the central stage to a stage of the row multiplexer.

5. Camera according to claim 2, wherein the second succession has $N+1$ stages and the signals representing the successive elements from a row of the image are supplied at the output of one or other of the end stages of the successions in relation to the movement direction of the image, said end stages being connected to one stage of the row multiplexer.

6. Camera according to claim 5, wherein the control circuit has a charge-voltage converter connected to said multiplexing output of the column multiplexer and connected by a connection of a voltage-charge converter connected to the central stage of the processor.

7. Camera according to claim 2, wherein each processor has a U-shape, the two successions of stages forming the branches of the U being parallel to one another and next to a row of detectors, the central stage forming the base of the U.

8. Camera according to claim 7, wherein the successions have in each case $N+1$ stages.

9. Camera according to claim 8, wherein for each processor, the end stages of the successions are connected to switches having a CCD-type structure, each of these switches being connected to the same stage of the row multiplexer.

10. Camera according to claim 1, wherein the control circuit has a CCD-type structure with one stage and constitutes a switch.

11. Camera according to claim 10, wherein each stage of the processor is at least N times more extensive than a stage of the column multiplexer.

12. Camera according to claim 1, wherein the control circuit has a three-stage CCD-type structure, of which one stage constitutes a capacitor of capacitance Cs and is connected to the output of the column multiplexer, another stage constitutes a capacitor of capacitance Cp and is connected to the central stage of the processor and another stage constitutes a switch, said control circuit constituting a switch performing the bottom leveling and partitioning functions of the charges from the column multiplexer.

13. Camera according to claim 12, wherein each stage of the processor is at least $N(Cs/(Cs+Cp))$ times more extensive than a stage of the column multiplexer.

* * * * *